(12) United States Patent
Huang

(10) Patent No.: US 8,384,458 B1
(45) Date of Patent: Feb. 26, 2013

(54) PHASE INTERPOLATION CIRCUIT

(75) Inventor: Chen-Wei Huang, Kaohsiung (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 13/330,615

(22) Filed: Dec. 19, 2011

(30) Foreign Application Priority Data

Sep. 20, 2011 (TW) .............................. 100133747 A

(51) Int. Cl.
*H03K 3/017* (2006.01)
(52) U.S. Cl. ........................................ 327/175; 327/355
(58) Field of Classification Search .................. None
See application file for complete search history.

(56) References Cited

U.S. PATENT DOCUMENTS

| | | | |
|---|---|---|---|
| 6,121,808 A * | 9/2000 | Gaudet .......................... | 327/231 |
| 6,329,859 B1 * | 12/2001 | Wu ................. | 327/291 |
| 6,340,909 B1 | 1/2002 | Zerbe et al. | |
| 6,380,783 B1 * | 4/2002 | Chao et al. .................... | 327/258 |
| 6,384,653 B1 | 5/2002 | Broome | |
| 6,509,773 B2 | 1/2003 | Buchwald et al. | |
| 7,180,352 B2 | 2/2007 | Mooney et al. | |
| 7,196,564 B2 * | 3/2007 | Rajagopal et al. ............ | 327/246 |
| 7,256,627 B1 * | 8/2007 | Talbot et al. .................. | 327/141 |
| 7,298,195 B2 | 11/2007 | Freyman et al. | |
| 8,242,821 B2 * | 8/2012 | Bae et al. ....................... | 327/158 |
| 2003/0123594 A1 | 7/2003 | Glenn et al. | |
| 2005/0024117 A1 | 2/2005 | Kubo et al. | |
| 2006/0039487 A1 * | 2/2006 | Best ............................... | 375/260 |
| 2006/0055430 A1 | 3/2006 | Pickering et al. | |
| 2009/0289676 A1 * | 11/2009 | Takai ............................. | 327/158 |
| 2010/0079180 A1 * | 4/2010 | Kim et al. ..................... | 327/158 |
| 2011/0128061 A1 * | 6/2011 | Liu et al. ....................... | 327/298 |

OTHER PUBLICATIONS

Garlepp et al, "A Portable Digital DLL for High-Speed CMOS Interface Circuits," IEEE Journal of Solid-State Circuits, vol. 34, No. 5, May 1999, pp. 632-644.

* cited by examiner

*Primary Examiner* — Cassandra Cox
(74) *Attorney, Agent, or Firm* — Jianq Chyun IP Office

(57) ABSTRACT

A phase interpolation circuit including a first multiplexer, a second multiplexer, an interpolator and a duty-cycle repeater is provided. The first multiplexer receives a plurality of even order signals. The second multiplexer receives a plurality of odd order signals. The interpolator receives a first reference signal composed of one of the even order signals through the first multiplexer, and receives a second reference signal composed of one of the odd order signals through the second multiplexer. The interpolator divides a phase difference between the first reference signal and the second reference signal into a plurality of sub-phases according to a digital control signal, and selects one of the sub-phases to generate a differential input signal. The duty-cycle repeater adjusts the duty cycle of the differential input signal and accordingly generates a differential output signal with 50% duty cycle.

8 Claims, 4 Drawing Sheets

PHASE INTERPOLATION CIRCUIT

CROSS-REFERENCE TO RELATED APPLICATION

This application claims the priority benefit of Taiwan application serial no. 100133747, filed on Sep. 20, 2011. The entirety of the above-mentioned patent application is hereby incorporated by reference herein and made a part of this specification.

BACKGROUND OF THE INVENTION

1. Field of the Invention

The invention relates to a phase interpolation circuit. Particularly, the invention relates to a phase interpolation circuit capable of generating a differential output signal with 50% of duty cycle.

2. Description of Related Art

In a high-speed transmission interface module (for example, a universal serial bus (USB) 3.0 interface module), a clock and data recovery circuit is generally configured to recover signals containing noise components, where a phase interpolation circuit is a core circuit composing the clock and data recovery circuit. Therefore, it is an important issue to ameliorate the phase interpolation circuit to improve whole performance of the clock and data recovery circuit.

Generally, the phase interpolation circuit can be implemented through current mode logic to cope with the requirement of a high-speed transmission. However, the phase interpolation circuit of the current mode logic has following disadvantages: (1) a linearity thereof is liable to be influenced by a parasitic capacitance and a front-end circuit load, so that a duty cycle of an output signal has a great variation, especially under an influence of process variation; (2) it is of no avail for low-voltage operations, which leads to a limited operating range.

Therefore, how to adjust the duty cycle of the output signal or implement the low-voltage operations is an important issue to be developed in design of the phase interpolation circuit.

SUMMARY OF THE INVENTION

The invention is directed to a phase interpolation circuit, in which a duty-cycle repeater is used to adjust a duty cycle of a differential output signal. In this way, a problem of dramatic variation of the duty cycle of the differential output signal due to an influence of process variation is resolved.

The invention provides a phase interpolation circuit including a first multiplexer, a second multiplexer, an interpolator and a duty-cycle repeater. The first multiplexer receives a plurality of even order signals. The second multiplexer receives a plurality of odd order signals. The interpolator receives a first reference signal composed of one of the even order signals through the first multiplexer, and receives a second reference signal composed of one of the odd order signals through the second multiplexer. The interpolator divides a phase difference between the first reference signal and the second reference signal into a plurality of sub-phases according to a digital control signal, and selects one of the sub-phases to generate a differential input signal. The duty-cycle repeater adjusts a duty cycle of the differential input signal to generate a differential output signal with 50% of the duty cycle.

In an embodiment of the invention, the first multiplexer selects two even order signals complementing each other from the even order signals, and the interpolator selects one of the two selected even order signals as the first reference signal. Moreover, the second multiplexer selects two odd order signals complementing each other from the odd order signals, and the interpolator selects one of the two selected odd order signals as the second reference signal.

In an embodiment of the invention, the interpolator includes a bias generating unit, a current source, a load unit and an input unit. The bias generating unit generates a plurality of first biases according to the digital control signal, and generates a plurality of second biases according to a complement of the digital control signal. The current source receives the first biases and the second biases to generate a first current and a second current. The input unit is electrically connected between the load unit and the current source, and switches paths that the first current and the second current are conducted to the load unit according to the first reference signal and the second reference signal, so as to generate the differential input signal.

According to the above descriptions, the duty-cycle repeater is used to adjust the duty cycle of the differential output signal to avoid dramatic variation of the duty cycle of the differential output signal due to influence of a process variation. Moreover, the bias generating unit in the interpolator is independently configured outside a cascade structure formed by the load unit, the input unit and the current source. In this way, the interpolator avails implementing a low-voltage operation, and an operation range of the phase interpolation circuit is expanded.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
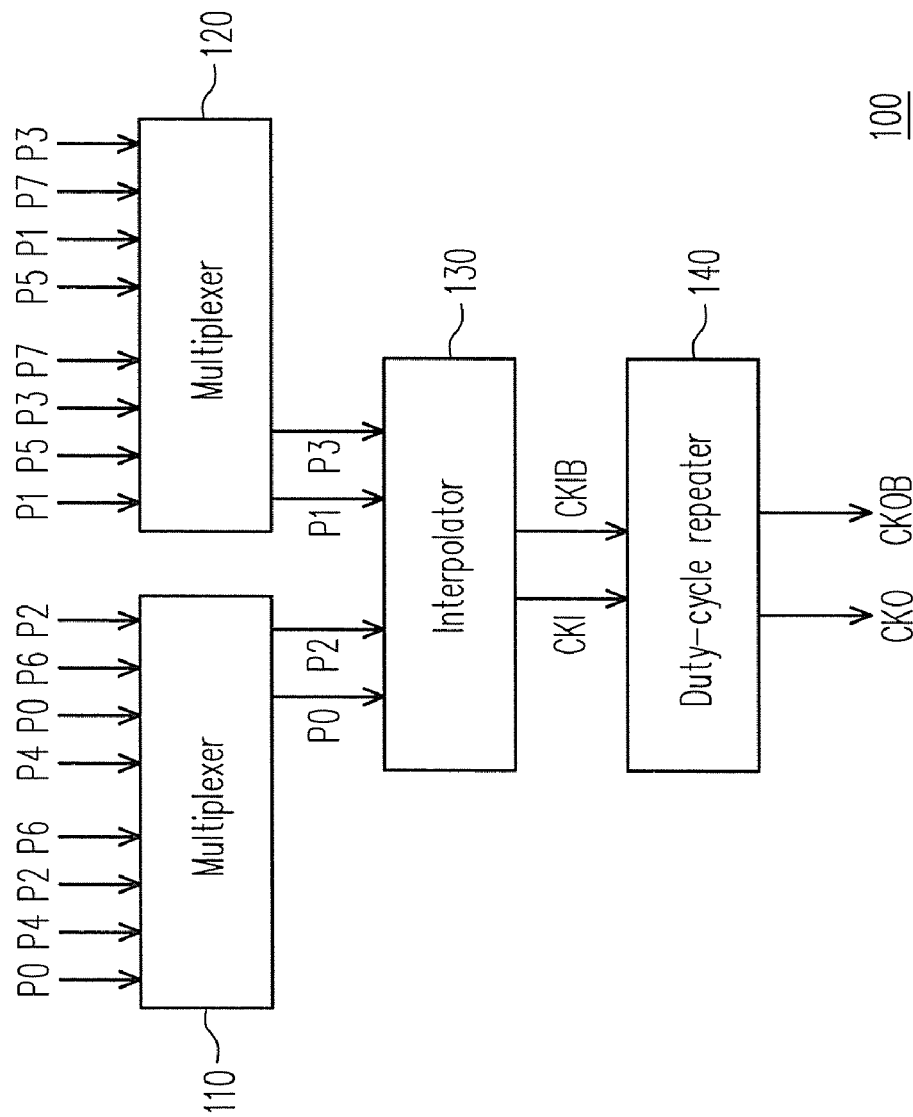
FIG. 1 is a block schematic diagram of a phase interpolation circuit according to an embodiment of the invention.

FIG. 1 is a block schematic diagram of a phase interpolation circuit according to an embodiment of the invention. Referring to FIG. 1, the phase interpolation circuit 100 includes a multiplexer 110, a multiplexer 120, an interpolator 130 and a duty-cycle repeater 140. The phase interpolation circuit 100 can be used in a clock and data recovery circuit, especially in a clock and data recovery circuit of a high-speed transmission interface module (for example, a universal serial bus (USB) 3.0 interface module).

Referring to FIG. 1, the multiplexer 110 and the multiplexer 120 respectively receive a plurality of phase signals. For example, in an exemplary embodiment, by equally dividing 360 degrees into 8 parts, 8 phase signals P0-P7, i.e. 0°, 45°, 90°, 135°, . . . , 315° are obtained. The 8 phase signals P0-P7 respectively have a phase difference of 45°. Moreover, the phase signals P0, P2, P4 and P6 are respectively an even multiple of the basic phase of 45°, so that the phase signals P0, P2, P4 and P6 can be regarded as even order signals. Moreover, the phase signals P1, P3, P5 and P7 are respectively an odd multiple of the basic phase of 45°, so that the phase signals P1, P3, P5 and P7 can be regarded as odd order signals.

In an exemplary embodiment, the multiplexer 110 receives four phase signals P0, P2, P4 and P6, i.e. four even order signals P0, P2, P4 and P6. Moreover, the multiplexer 120 receives four phase signals P1, P3, P5 and P7, i.e. four odd order signals P1, P3, P5 and P7. In other words, to facilitate a phase control, a method of parity separation is used to distribute the phase signals to the two multiplexers, for example, the multiplexer 110 receives the phase signals of the even orders (P0, P2, P4 and P6) (i.e. the even order signals), and the second multiplexer 120 receives the phase signals of the odd orders (P1, P3, P5 and P7) (i.e. the odd order signals).

The multiplexer 110 and the multiplexer 120 respectively select two phase signals for outputting. For example, in the present embodiment, the multiplexer 110 selects the phase signal P0 and the phase signal P2 complementing to each other from the phase signals P0, P2, P4 and P6, and the multiplexer 120 selects the phase signal P1 and the phase signal P3 complementing to each other from the phase signals P1, P3, P5 and P7. Moreover, the interpolator 130 selects one of the two phase signals P0 and P2 (for example, the phase signal P0) come from the multiplexer 110 as a reference signal, and selects one of the two phase signals P1 and P3 (for example, the phase signal P1) come from the multiplexer 120 as another reference signal.

In other words, the interpolator 130 receives a reference signal (for example, the phase signal P0) composed of one of the phase signals P0, P2, P4 and P6 (i.e. the even order signals) through the multiplexer 110, and receives a reference signal (for example, the phase signal P1) composed of one of the phase signals P1, P3, P5 and P7 (i.e. the odd order signals) through the multiplexer 120. After the operation of signal selection is completed, the phase interpolation circuit 100 transmits the selected reference signals to the phase interpolator 130 for phase division. Here, the interpolator 130 divides a phase difference between the two reference signals into a plurality of sub-phases according to a digital control signal, and selects one of the sub-phases to generate a differential input signal.

In this way, the interpolator 130 can divide a plurality of the sub-phases between the two reference signals. Moreover, by switching the multiplexers 110 and 120, the interpolator 130 can receive two reference signals composed of different phase signals, so as to generate more different sub-phases. In addition, in the present embodiment, the interpolator 130 receives the two reference signals in a differential input mode, and generates a differential input signal in a differential output mode. Therefore, the differential input signal of the present embodiment is composed of an input signal CKI and an input signal CKIB.

On the other hand, the duty-cycle repeater 140 adjusts a duty cycle of the differential input signal to generate a differential output signal with 50% of the duty cycle, where the differential output signal is composed of an output signal CKO and an output signal CKOB. In other words, the phase interpolation circuit 100 can adjust the duty cycle of the differential output signal through the duty-cycle repeater 140, so as to resolve a problem of dramatic variation of the duty cycle of the differential output signal due to an influence of a process variation.

In order to fully convey the spirit of the invention to those skilled in the art, detailed structures of the interpolator 130 and the duty-cycle repeater 140 are described below.

Figure 2:
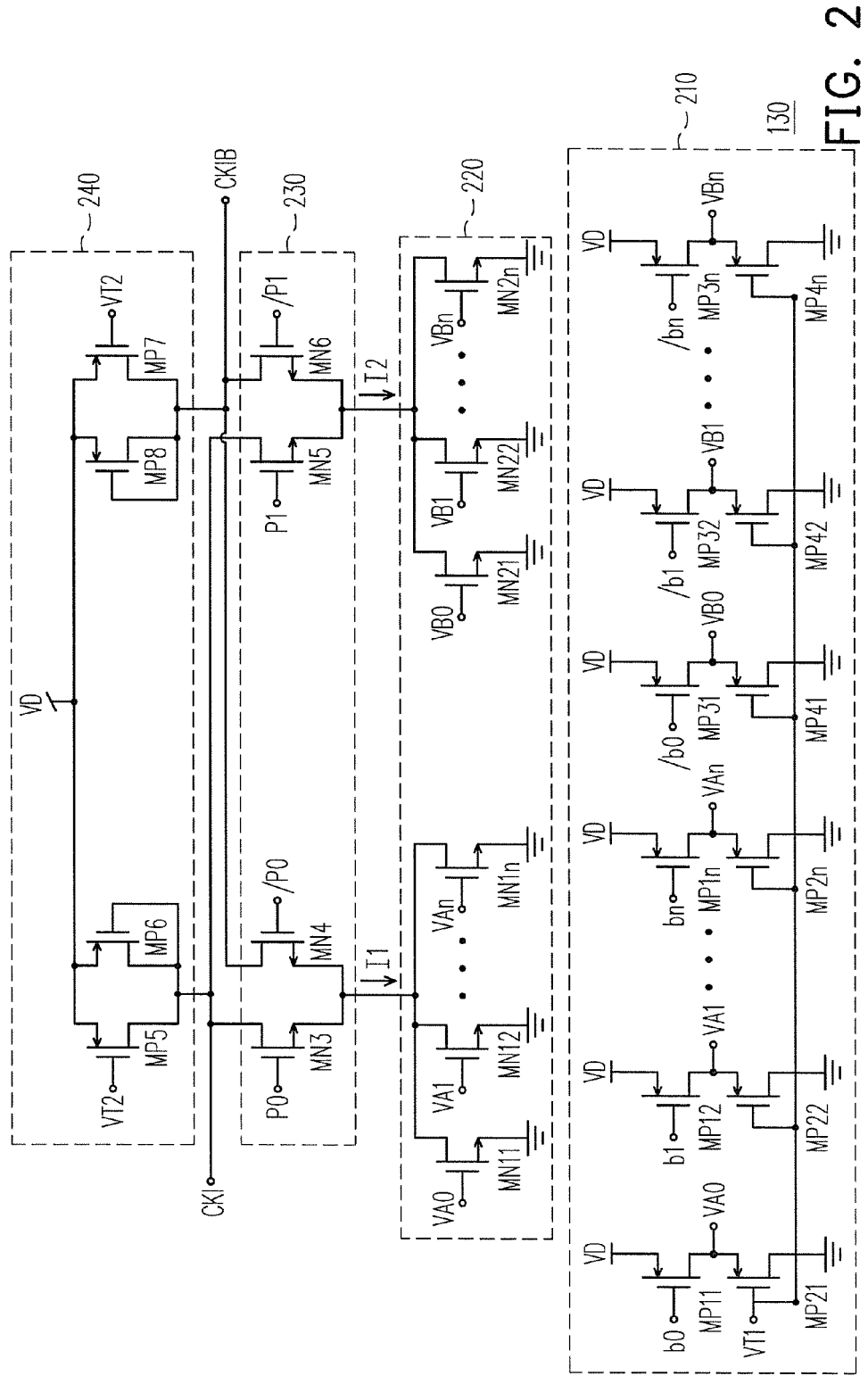
FIG. 2 is a circuit diagram of an interpolator according to an embodiment of the invention.

FIG. 2 is a circuit diagram of an interpolator according to an embodiment of the invention. Referring to FIG. 2, the interpolator 130 includes a bias generating unit 210, a current source 220, a load unit 240 and an input unit 230. Here, it is assumed that the two reference signals received by the interpolator 130 are respectively the phase signal P0 and the phase signal P1, and for simplicity's sake, the two reference signals are indicated by P0 and P1. Moreover, the digital control signal received by the interpolator 130 is represented as {bn, . . . , b1, b0}, and a complement of the digital control signal is represented as {/bn, . . . , /b1, /b0}.

As shown in FIG. 2, the bias generating unit 210 generates a plurality of biases VA0-VAn according to the digital control signal {bn, . . . , b1, b0}, and generates a plurality of biases VB0-VBn according to the complement of the digital control signal {/bn, . . . , /b1, /b0}. The current source 220 receives the biases VA0-VAn and VB0-VBn to generate a current I1 and a current I2. The input unit 230 is electrically connected between the load unit 240 and the current source 220, and switches paths that the currents I1 and I2 are conducted to the load unit 240 according to the reference signals P0 and P1. In this way, the input unit 230 generates the differential input signal composed of the input signals CKI and CKIB.

It should be noticed that regarding a circuit structure of the interpolator 130, the load unit 240, the input unit 230 and the current source 220 are connected in cascade to form a cascade structure of three stacked layers, and the bias generating unit 210 is independently configured outside the cascade structure. Moreover, the more the number of the stacked layer is, the greater a power voltage required by the circuit is. Therefore, compared to the conventional interpolator, since the conventional interpolator has a cascade structure of more than four stacked layers, the interpolator 130 of the present embodiment not only avails implementing a low-voltage operation, but also avails reducing a parasitic capacitance effect, so as to achieve a better performance under a high-speed operation environment.

Further, the current source 220 includes N-type transistors MN11-MN1n and N-type transistors MN21-MN2n. Drains of the N-type transistors MN11-Mn1n and MN21-MN1 are electrically connected to the input unit 230, and sources of the N-type transistors MN11-Mn1n and MN21-MN1 are electrically connected to ground. Moreover, the N-type transistors MN11-Mn1n and the N-type transistors MN21-MN1 are controlled by the biases VA0-VAn and VB0-VBn generated by the bias generating unit 210 for adjusting magnitudes of the currents I1 and I2.

The input unit 230 includes N-type transistors MN3-MN6. Drains of the N-type transistors MN3-MN6 are electrically connected to the load unit 240. Moreover, sources of the N-type transistors MN3 and MN4 are electrically connected to the drains of the N-type transistors MN11-MN1n, and sources of the N-type transistors MN5 and MN6 are electrically connected to the drains of the N-type transistors MN21-MN2n. Here, the N-type transistors MN3 and MN4 form a differential input pair, and gates thereof respectively receive the reference signal P0 and an inverted signal /P0 of the reference signal P0. Similarly, the N-type transistors MN5 and MN6 form another differential input pair, and gates thereof respectively receive the reference signal P1 and an inverted signal /P1 of the reference signal P1.

The load unit 240 includes P-type transistors MP5-MP8. Sources of the P-type transistors MP5-MP8 receive a power voltage VD. Moreover, a gate of the P-type transistor MP6 is electrically connected to a drain thereof, and a gate of the P-type transistor MP8 is electrically connected to a drain thereof, so as to respectively form the diode structure. Moreover, the P-type transistor MP5 and the P-type transistor MP6 are electrically connected in parallel, and a gate of the P-type transistor MP5 receives a fixed voltage VT2. Similarly, the P-type transistor MP7 and the P-type transistor MP8 are electrically connected in parallel, and a gate of the P-type transistor MP7 receives the fixed voltage VT2. In this way, the two P-type transistors connected in parallel can provide better linearity and anti-noise capability.

The bias generating unit 210 includes P-type transistors MP11-MP1n, P-type transistors MP21-MP2n, P-type transistors MP31-MP3n, and P-type transistors MP41-MP4n. A source of the P-type transistor MP11 receives the power voltage VD, A gate of the P-type transistor MP11 receives a bit b0 of the digital control signal, and a drain of the P-type transistor MP11 is electrically connected to a gate of the N-type transistor MN1 in the current source 220. Moreover, a source of the P-type transistor MP21 is electrically connected to the drain of the P-type transistor MP11, a gate of the P-type transistor MP21 receives a fixed voltage VT1, and a drain of the P-type transistor MP21 is electrically connected to the ground. Deduced by analogy for connections of the P-type transistors MP12-MP1n and the P-type transistors MP22-MP2n.

Moreover, connections between the P-type transistors MP31-MP3n and the P-type transistors MP41-MP4n are similar to that between the P-type transistors MP11-MP1n and the P-type transistors MP21-MP2n, though a main difference there between is that the gates of the P-type transistors MP11-MP1n receive the digital control signal {bn, . . . , b1, b0}, and the gates of the P-type transistors MP31-MP3n receive the complement of the digital control signal {/bn, . . . , /b1, /b0}. Therefore, in an actual operation, conducting states of the P-type transistors MP11-MP1n are just opposite to conducting states of the P-type transistors MP31-MP3n.

According to the above descriptions, the interpolator 130 applies a differential input and differential output structure, so that each of the units has a similar structure to receive or generate an inverted signal. Moreover, the phase interpolation performed by the interpolator 130 can be represented by a following equation (1):

$$\phi_{AB} = \frac{w}{W}\phi_A + \frac{W-w}{W}\phi_B \quad (1)$$

Where, $\Phi_A$ and $\Phi_B$ are respectively phases of the reference signals P0 and P1, W is a total interpolation amount, w is an interpolation amount, $\Phi_{AB}$ is an interpolated phase of the differential input signal.

In operation, the fixed voltage VT1 in the bias generating unit 210 is use to bias the P-type transistors MP21-MP2n and the P-type transistors MP41-MP4n to a linear region. Therefore, regarding the P-type transistors MP11 and MP21 connected in series, when the P-type transistor MP11 is turned on, the bias VA0 is pulled up to the power voltage VD. Now, the N-type transistor MN11 in the current source 220 is turned on to increase a current amount of the current I1. Comparatively, when the P-type transistor MP11 is turned off, the bias VA0 is pulled down to the ground level. Now, the N-type transistor MN11 in the current source 220 is turned off, and the current amount of the current I1 is decreased. In other words, along with variations of the biases VA0-VAn and VB0-VBn, a conducted number of the N-type transistors MN11-MN1n and MN21-MN2n in the current source 220 is different. In this way, the currents I1 and I2 provided by the current source 220 are also varied, so as to adjust the interpolation amount w during the phase interpolation.

For example, if the current source 220 includes six N-type transistors MN11-MN13 and MN21-MN23, and the phases of the reference signals P0 and P1 are respectively 0° and 45°, in control of the interpolation phase, a resolution of the digital control signal is three bits. Moreover, when the digital control signal is {011}, only the P-type transistor MP11 of the three P-type transistors MP11-MP13 is turned on. Namely, in the three N-type transistors MN11-MN13 used for controlling the current I1, only the N-type transistor MN11 is turned on. Therefore, according to the equation (1), $\Phi_A=0$, $\Phi_B=45$, W=3 and w=1, so that a phase of the input signal CKI generated by the differential input pair MN3 and MN4 is 30°.

Figure 3:
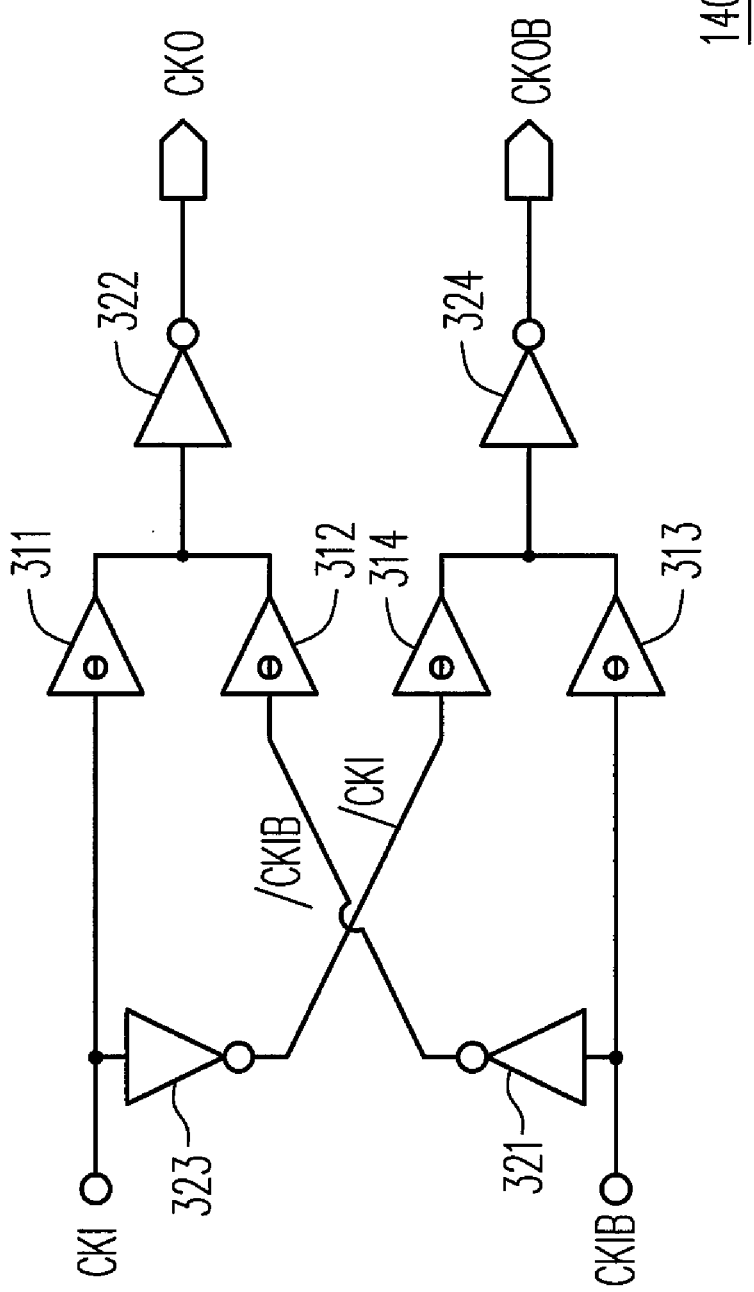
FIG. 3 is a circuit diagram of a duty-cycle repeater according to an embodiment of the invention.

FIG. 3 is a circuit diagram of a duty-cycle repeater according to an embodiment of the invention. Referring to FIG. 3, the duty-cycle repeater 140 includes phase blenders 311-314 and inverters 321-324. An input terminal of the inverter 322 is electrically connected to output terminals of the phase blender 311 and the phase blender 312, simultaneously, and an input terminal of the phase blender 312 is electrically connected to an output terminal of the inverter 321. Here, the phase bender 311 inverts the input signal CKI and adjusts a duty cycle of the inverted input signal CKI.

On the other hand, the inverter 321 inverts the input signal CKIB to generate an inverting input signal /CKIB. The phase blender 312 inverts the inverting input signal /CKIB, and adjusts a duty cycle of the inverted inverting input signal /CKIB. Moreover, as levels of the input signal CKI and the inverting input signal /CKIB are varied, the two phase blenders 311 and 312 drive the inverter 322 in different manners. Therefore, the output signal CKO generated by the inverter 322 can be represented as: CKO=(CKI+/CKIB)/2. Therefore, a duty cycle of the output signal CKO generated by the inverter 322 is adjusted to 50%, and skew of the output signal CKO is eliminated.

Similarly, an input terminal of the inverter 324 is electrically connected to output terminals of the phase blender 313 and the phase blender 314, simultaneously, and an input terminal of the phase blender 314 is electrically connected to an output terminal of the inverter 323. Here, the phase bender 313 inverts the input signal CKIB and adjusts a duty cycle of the inverted input signal CKIB. Moreover, the inverter 323 inverts the input signal CKI to generate an inverting input signal /CKI. The phase blender 314 inverts the inverting input signal /CKI, and adjusts a duty cycle of the inverted inverting input signal /CKI. Moreover, the output signal CKOB generated by the inverter 324 can be represented as: CKOB=(CKIB+/CKI)/2. Therefore, a duty cycle of the output signal CKOB generated by the inverter 324 is adjusted to 50%, and skew of the output signal CKOB is eliminated.

Figure 4:
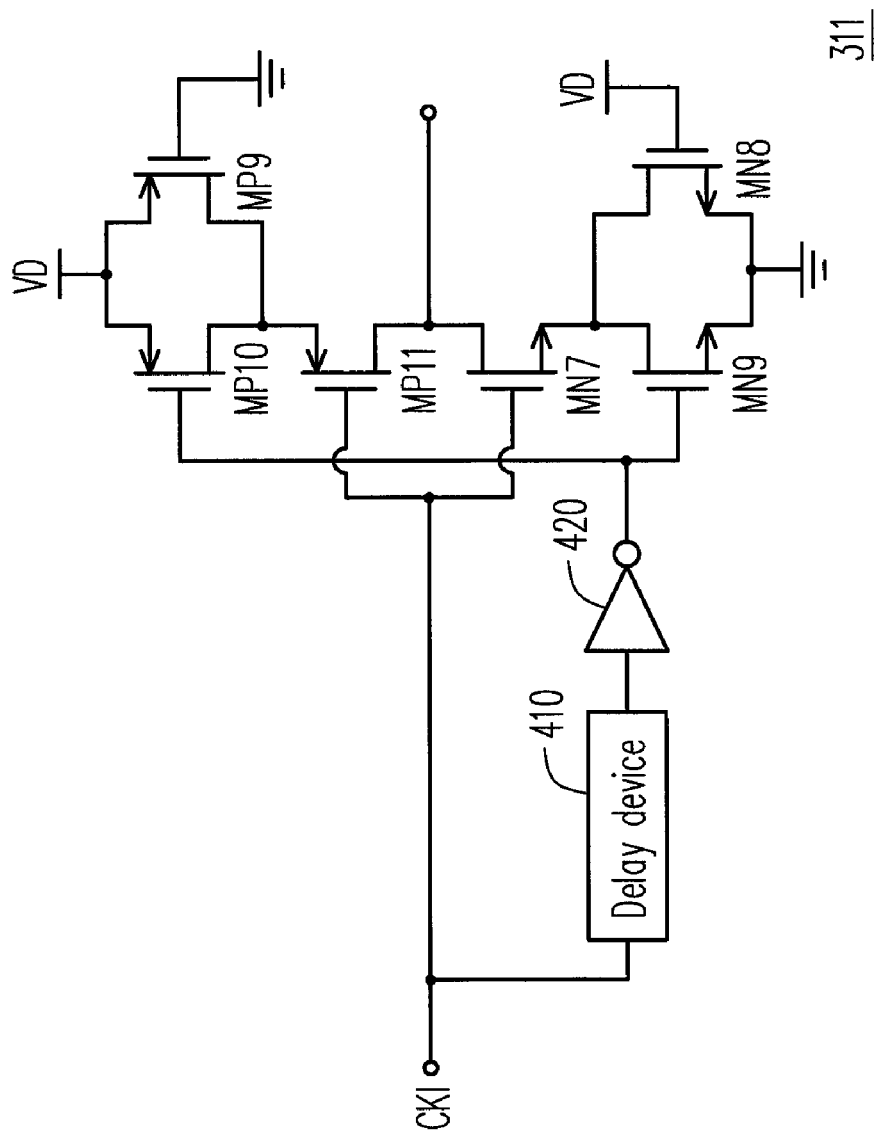
FIG. 4 is a circuit diagram of a phase blender according to an embodiment of the invention.

FIG. 4 is a circuit diagram of a phase blender according to an embodiment of the invention. The circuit of the present embodiment is used replace a conventional phase blender, therefore, when the circuit of the present embodiment is applied to the embodiment of FIG. 3, sizes of the phase blenders 311, 312, 313 and 314 are equivalent, which is different to the conventional inverter-based phase blenders that have a shortage that the sizes of the four phase blenders are not equivalent if the output phase is accurately adjusted to 50%. For example, B. W. Garlepp et al., "A Portable Digital DLL for High-Speed CMOS Interface Circuits", IEEE JOURNAL OF SOLID-STATE CIRCUITS, VOL. 34, No. 5, pp. 632-644, May 1999. Referring to FIG. 4, the phase blender 311 includes P-type transistors MP9-MP11, N-type transistors MN7-MN9, a delay device 410 and an inverter 420. Sources of the P-type transistor MP9 and the P-type transistor MP10 receive the power voltage VD. A gate of the P-type transistor MP9 is electrically connected to the ground, and a drain of the P-type transistor MP9 is electrically connected to a drain of the P-type transistor MP10. A source of the P-type transistor MP11 is electrically connected to the drain of the P-type transistor MP10, a gate of the P-type transistor MP11 receives the input signal CKI, and a drain of the P-type transistor MP11 is electrically connected to the inverter 322.

Moreover, a drain of the N-type transistor MN7 is electrically connected to the drain of the P-type transistor MP11, a gate of the N-type transistor MN7 receives the input signal CKI. Drains of the N-type transistor MN8 and the N-type transistor MN9 are electrically connected to a source of the N-type transistor MN7. Moreover, a gate of the N-type transistor MN8 receives the power voltage VD, and a drain of the N-type transistor MN8 is electrically connected to the ground. A gate of the N-type transistor MN9 is electrically connected to the gate of the P-type transistor MP10, and a drain of the N-type transistor MN9 is electrically connected to the ground. The delay device 410 delays the input signal CKI. The inverter 420 inverts the delayed input signal CKI, and outputs a signal to the gate of the N-type transistor MN9 and the gate of the P-type transistor MP10.

In operation, the P-type transistor MP11 and the N-type transistor MN7 form an inverter to invert the input signal CKI. Moreover, the input signal CKI is delayed by the delay device 410 and is inverted by the inverter 420. Then, the output signal of the inverter 420 is used to control the P-type transistor MP10 and the N-type transistor MN9, so as to adjust a charging current supplied to the P-type transistor MP11 and a discharging current flowing through the N-type transistor MN7. For example, when a level of the output signal generated by the inverter 420 is decreased, the charging current supplied to the P-type transistor MP11 is increased, and the discharging current flowing through the N-type transistor MN7 is decreased, so that the duty cycle of the inverted input signal CKI is increased. Comparatively, when the level of the output signal generated by the inverter 420 is increased, the duty cycle of the inverted input signal CKI is decreased. In this way, during a process of inverting the input signal CKI, the duty cycle of the inverted input signal CKI can be adjusted.

In summary, since a duty cycle of a signal output by the phase interpolator is easy to be varied, in the invention, the duty-cycle repeater is used to adjust the duty cycle of the signal output by the phase interpolator, so as to resolve the problem of dramatic variation of the duty cycle thereof due to influence of a process variation. Moreover, by changing an internal bias, the bias generating unit in the interpolator is independently configured outside the cascade structure. In this way, the interpolator avails implementing a low-voltage operation, and an operation range of the phase interpolation circuit is expanded.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A phase interpolation circuit, comprising:
   a first multiplexer, receiving a plurality of even order signals;
   a second multiplexer, receiving a plurality of odd order signals;
   an interpolator, receiving a first reference signal composed of one of the even order signals through the first multiplexer, and receiving a second reference signal composed of one of the odd order signals through the second multiplexer, wherein the interpolator divides a phase difference between the first reference signal and the second reference signal into a plurality of sub-phases according to a digital control signal, and selects one of the sub-phases to generate a differential input signal; and
   a duty-cycle repeater, adjusting a duty cycle of the differential input signal to generate a differential output signal with 50% of the duty cycle,
   wherein the interpolator comprises:
   a bias generating unit, generating a plurality of first biases according to the digital control signal, and generating a plurality of second biases according to a complement of the digital control signal;
   a current source, receiving the first biases and the second biases to generate a first current and a second current;
   a load unit; and
   an input unit, electrically connected between the load unit and the current source, and switching paths that the first current and the second current are conducted to the load unit according to the first reference signal and the second reference signal, so as to generate the differential input signal.

2. The phase interpolation circuit as claimed in claim 1, wherein the first multiplexer selects two even order signals from the even order signals, and the interpolator selects one of the two selected even order signals as the first reference signal, the second multiplexer selects two odd order signals from the odd order signals, and the interpolator selects one of the two selected odd order signals as the second reference signal.

3. The phase interpolation circuit as claimed in claim 1, wherein the bias generating unit comprises:
   a plurality of first P-type transistors, having sources receiving a power voltage, gates receiving the digital control signal, and drains generating the first biases;
   a plurality of second P-type transistors, having sources electrically connected to the drains of the first P-type transistors, gates receiving a first fixed voltage, and drains electrically connected to ground;
   a plurality of third P-type transistors, having sources receiving the power voltage, gates receiving the complement of the digital control signal, and drains generating the second biases; and
   a plurality of fourth P-type transistors, having sources electrically connected to the drains of the third P-type transistors, gates receiving the first fixed voltage, and drains electrically connected to the ground.

4. The phase interpolation circuit as claimed in claim 3, wherein the current source comprises:
   a plurality of first N-type transistors, having drains electrically connected to the input unit, gates electrically connected to the drains of the first P-type transistors, and sources electrically connected to the ground; and
   a plurality of second N-type transistors, having drains electrically connected to the input unit, gates electrically connected to the drains of the third P-type transistors, and sources electrically connected to the ground.

5. The phase interpolation circuit as claimed in claim 4, wherein the input unit comprises:

a third N-type transistor, having a drain electrically connected to the load unit, a gate receiving the first reference signal, and a source electrically connected to the drains of the first N-type transistors;

a fourth N-type transistor, having a drain electrically connected to the load unit, a gate receiving an inverted signal of the first reference signal, and a source electrically connected to the drains of the first N-type transistors;

a fifth N-type transistor, having a drain electrically connected to the load unit, a gate receiving the second reference signal, and a source electrically connected to the drains of the second N-type transistors; and a sixth N-type transistor, having a drain electrically connected to the load unit, a gate receiving an inverted signal of the second reference signal, and a source electrically connected to the drains of the second N-type transistors.

6. The phase interpolation circuit as claimed in claim 5, wherein the load unit comprises:

a fifth P-type transistor, having a source receiving the power voltage, a gate receiving a second fixed voltage, and a drain electrically connected to the drain of the third N-type transistor and the drain of the fifth N-type transistor;

a sixth P-type transistor, having a source receiving the power voltage, and a gate electrically connected to a drain of the sixth P-type transistor and the drain of the fifth P-type transistor;

a seventh P-type transistor, having a source receiving the power voltage, a gate receiving the second fixed voltage, and a drain electrically connected to the drain of the fourth N-type transistor and the drain of the sixth N-type transistor; and an eighth P-type transistor, having a source receiving the power voltage, and a gate electrically connected to a drain of the eighth P-type transistor and the drain of the seventh P-type transistor.

7. The phase interpolation circuit as claimed in claim 1, wherein the differential input signal comprises a first input signal and a second input signal, the differential output signal comprises a first output signal and a second output signal, and the duty-cycle repeater comprises:

a first phase blender, inverting the first input signal, and adjusting a duty cycle of the inverted first input signal;

a first inverter, inverting the second input signal to generate a first inverting input signal;

a second phase blender, inverting the first inverting input signal, and adjusting a duty cycle of the inverted first inverting input signal;

a second inverter, electrically connected to the first phase blender and the second phase blender, and inverting signals generated by the first phase blender and the second phase blender to generate the first differential output signal;

a third phase blender, inverting the second input signal, and adjusting a duty cycle of the inverted second input signal;

a third inverter, inverting the first input signal to generate a second inverting input signal;

a fourth phase blender, inverting the second inverting input signal, and adjusting a duty cycle of the inverted second inverting input signal; and a fourth inverter, electrically connected to the third phase blender and the fourth phase blender, and inverting signals generated by the third phase blender and the fourth phase blender to generate the second differential output signal.

8. The phase interpolation circuit as claimed in claim 7, wherein the first phase blender comprises:

a ninth P-type transistor, having a source receiving a power voltage, and a gate electrically connected to the ground;

a tenth P-type transistor, having a source receiving the power voltage, and a drain electrically connected to a drain of the ninth P-type transistor;

an eleventh P-type transistor, having a source electrically connected to the drain of the tenth P-type transistor, a gate receiving the first input signal, and a drain electrically connected to the second inverter;

a seventh N-type transistor, having a drain electrically connected to the drain of the eleventh P-type transistor, and a gate receiving the first input signal;

an eighth N-type transistor, having a drain electrically connected to a source of the seventh N-type transistor, a gate receiving the power voltage, and a drain electrically connected to the ground;

a ninth N-type transistor, having a drain electrically connected to the source of the seventh N-type transistor, a gate electrically connected to a gate of the tenth P-type transistor, and a drain electrically connected to the ground;

a delay device, delaying the first input signal; and a fifth inverter, inverting the delayed first input signal, and outputting a signal to the gate of the ninth N-type transistor and the gate of the tenth P-type transistor.

* * * * *